US006624695B2

(12) United States Patent
Sevic et al.

(10) Patent No.: US 6,624,695 B2
(45) Date of Patent: Sep. 23, 2003

(54) WAVEFORM PERSHAPING FOR EFFICIENCY IMPROVEMENTS IN DC TO RF CONVERSION

(75) Inventors: John Sevic, Los Gatos, CA (US); Khan M. Salam, Livermore, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/999,090

(22) Filed: Oct. 31, 2001

(65) Prior Publication Data

US 2003/0080813 A1 May 1, 2003

(51) Int. Cl.$^7$ .................................................. H03F 1/26
(52) U.S. Cl. ........................................ 330/149; 330/126
(58) Field of Search ................................. 330/126, 136, 330/149

(56) References Cited

U.S. PATENT DOCUMENTS 5,589,797 A * 12/1996 Gans et al. ................. 330/149
5,838,195 A * 11/1998 Szmurlo et al. ............ 330/149

* cited by examiner

Primary Examiner—Steven J. Mottola
(74) Attorney, Agent, or Firm—Thelen Reid & Priest LLP; Robert E. Krebs

(57) ABSTRACT

High efficiency DC to RF conversion with use of active harmonic insertion is provided for power amplification over a wide dynamic range of input signal level. Specifically, a power amplifier device including at least a final amplification stage is operated to receive an input signal of a fundamental frequency. A drive signal is produced which includes a fundamental signal component of the fundamental frequency and at least one harmonic signal component of a harmonic frequency that is substantially an integer multiple of the fundamental frequency, wherein relative phase shift and relative amplitude of the components are controlled over at least an order of magnitude of dynamic range of the input signal. As the signal level of the input signal decreases (or increases), the desired proportion of signal levels is maintained between the components. The drive signal is provided to the power amplifier device, and in response to the drive signal, an amplified output signal is produced at the final amplification stage.

25 Claims, 7 Drawing Sheets

WAVEFORM PERSHAPING FOR EFFICIENCY IMPROVEMENTS IN DC TO RF CONVERSION

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention relates generally to high efficiency conversion of DC power to RF power and specifically to high efficiency DC to RF conversion by the use of active harmonic insertion.

High efficiency amplifier devices operate by amplifying an input signal to produce an output signal and in the process efficiently convert DC power to RF power. Conventionally, efficiency improvements have been achieved by operating amplifiers in the non-linear region, utilizing amplifiers such as class F amplifiers. Class F amplifiers generally rely on a passive network at the load and/or source to create resonance at particular harmonics of the fundamental frequency of the output signal. Such passive networks are well known in the art, and voluminous references detail their various designs. However, reliance on passive networks to create resonance at particular harmonics has inherent limitations. These include the potential lack of sufficient energy at particular harmonics and difficulty in controlling the relative phases of the harmonics with respect to the phase of the fundamental frequency. In addition, passive networks are generally susceptible to manufacturing variances of components, which can cause imprecision in the resonant characteristics that further degrade the efficient performance of the amplifier device.

Some methods have been proposed for modifying harmonic passive network amplifier devices to improve efficiency. One method in particular involves increasing the Power Gain ($G_P$) of the amplifier device in order to increase its Power Added Efficiency (PAE). The relationship between $G_P$ and PAE is defined according to the following equation:

$$PAE = DE\left(1 - \frac{1}{G_p}\right)$$

where DE is the Drain Efficiency of the amplifier device. As can be seen by the relationship above, an increase in $G_P$ relates to an increase in PAE (given that DE is held constant). Accordingly, efficiency of the amplifier device, at least in terms of its PAE performance, can be increased by simply increasing $G_P$. One known method for increasing $G_P$ in this context involves the use of a pre-amplifier to pre-shape the input signal to a power amplifier such that the root mean squared (RMS) value of the input signal is increased. An increase in the RMS value of the input signal generally results in an increase in the power delivered to the load, which in turn increases $G_P$. These methods are illustrated by U.S. Pat. No. 6,249,183 issued to Bosch et al., Bernhard Ingruber et al., *High Efficiency Harmonic Control Amplifier*, IEEE MTT-S International Symposium on Microwaves (1996), and Sachihiro Toyoda, *High Efficiency Single and Push-Pull Power Amplifiers*, IEEE MTT-S International Microwave Symposium Digest (1993). Although $G_P$ can be increased in this manner, the use of a pre-amplifier to pre-shape the input signal to increase its RMS value restricts the dynamic range of the input signal over which the amplifier device can operate. As the signal level of the input signal changes, the input-output characteristics of the pre-amplifier varies, and consequently the intended pre-shaping of the input signal cannot be maintained.

One method has been proposed as an alternative to relying on harmonic passive networks for generation of harmonics at the output of the amplifier device. The method involves a power amplifier device that inserts harmonic signals at the output of a power amplifier, the harmonic signals being generated by sampling, frequency multiplying, amplifying, and phase-shifting the input signal to the power amplifier. By actively inserting harmonics to the output of the power amplifier, instead of relying on passive harmonic networks, this method avoids the inherent disadvantages associated with passive harmonic networks such as harmonic energy deficiency and variances in manufacturability. This method is illustrated by U.S. Pat. No. 5,172,072 issued to Willems et al. However, in this method, active insertion of harmonic signals at the output of the power amplifier requires higher power to drive the harmonics, since signal levels are considerably higher at the output of the power amplifier. In applications requiring high efficiency operation of amplifier device, such as wireless and other limited-power devices, the additional requirement to provide such high power may indeed be impracticable. Moreover, significant insertion loss may occur at the point where the harmonics are inserted into the output of the power amplifier.

SUMMARY OF THE INVENTION

High efficiency DC to RF conversion with use of active harmonic insertion is provided for power amplification over a wide dynamic range of input signal level. Specifically, a power amplifier device including at least a final amplification stage is operated to receive an input signal of a fundamental frequency. A drive signal is produced which includes a fundamental signal component of the fundamental frequency and at least one harmonic signal component of a harmonic frequency that is substantially an integer multiple of the fundamental frequency, wherein relative phase shift and relative amplitude of the components are controlled over at least an order of magnitude of dynamic range of the input signal. As the signal level of the input signal decreases (or increases), the desired proportion of signal levels is maintained between the components. The drive signal is provided to the power amplifier device, and in response to the drive signal, an amplified output signal is produced at the final amplification stage.

In a specific embodiment, a voltage controlled oscillator (VCO) is operated at substantially the harmonic frequency to produce a harmonic signal corresponding to the harmonic signal component, and the harmonic signal and a signal corresponding to the fundamental signal component are combined to produce the drive signal.

In another specific embodiment, a digital synthesizer is operated to synthesize the drive signal.

The invention will be better understood by reference to the following description in connection with the accompanying drawings.

DETAILED DESCRIPTION OF THE INVENTION

Figure 1A:
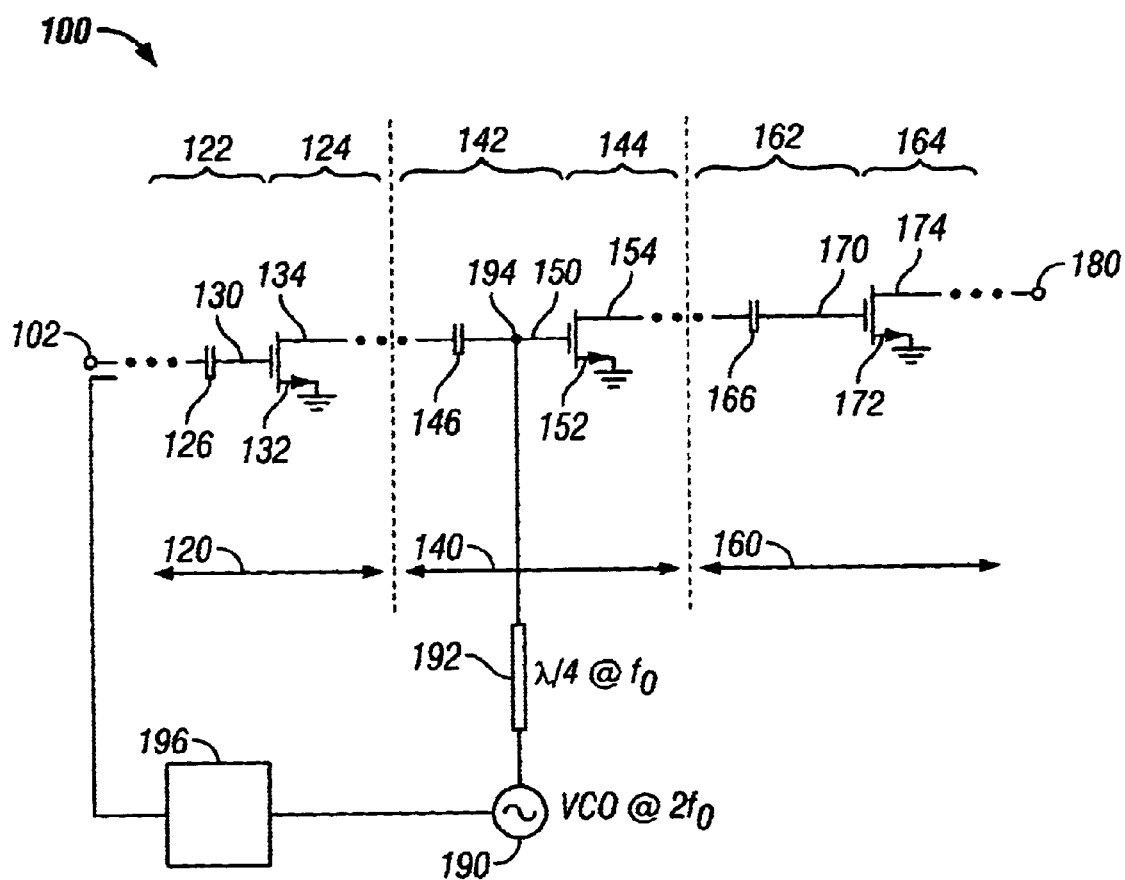
FIGS. 1A, 1B and 1C illustrate simplified circuit diagrams of a first embodiment in accordance with the present invention.
Figure 1B:
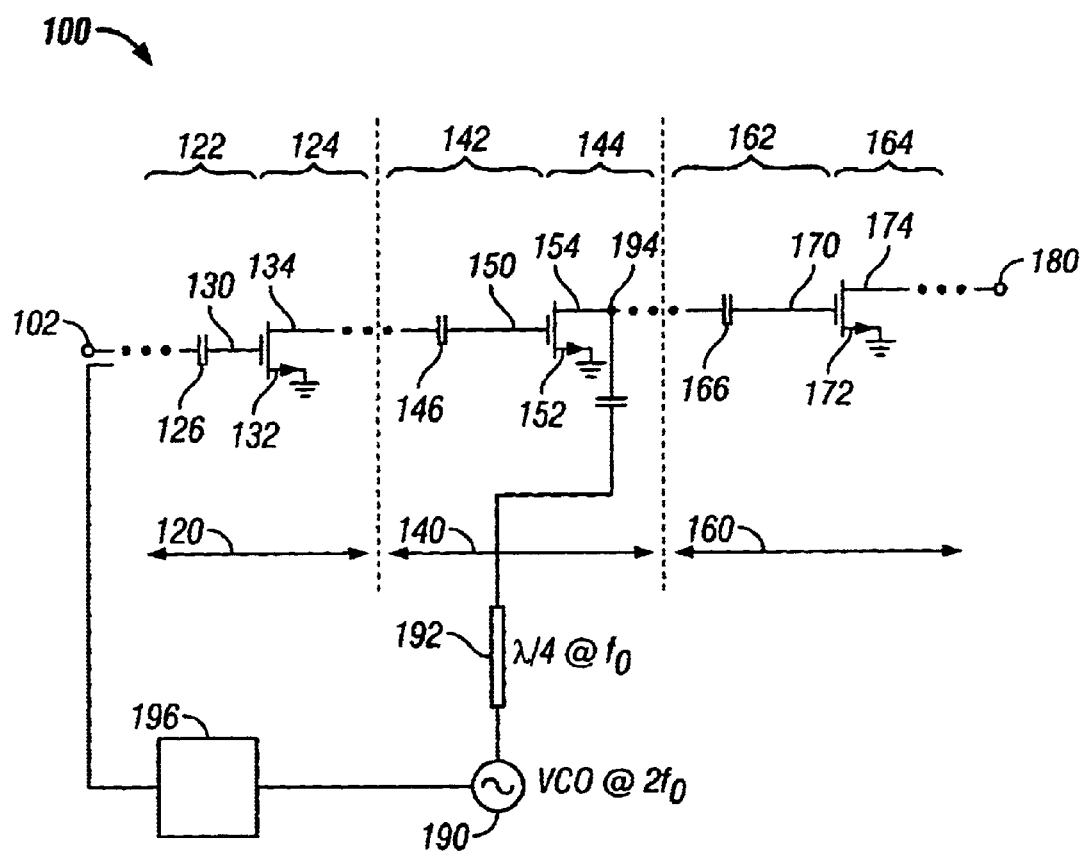
Figure 1C:
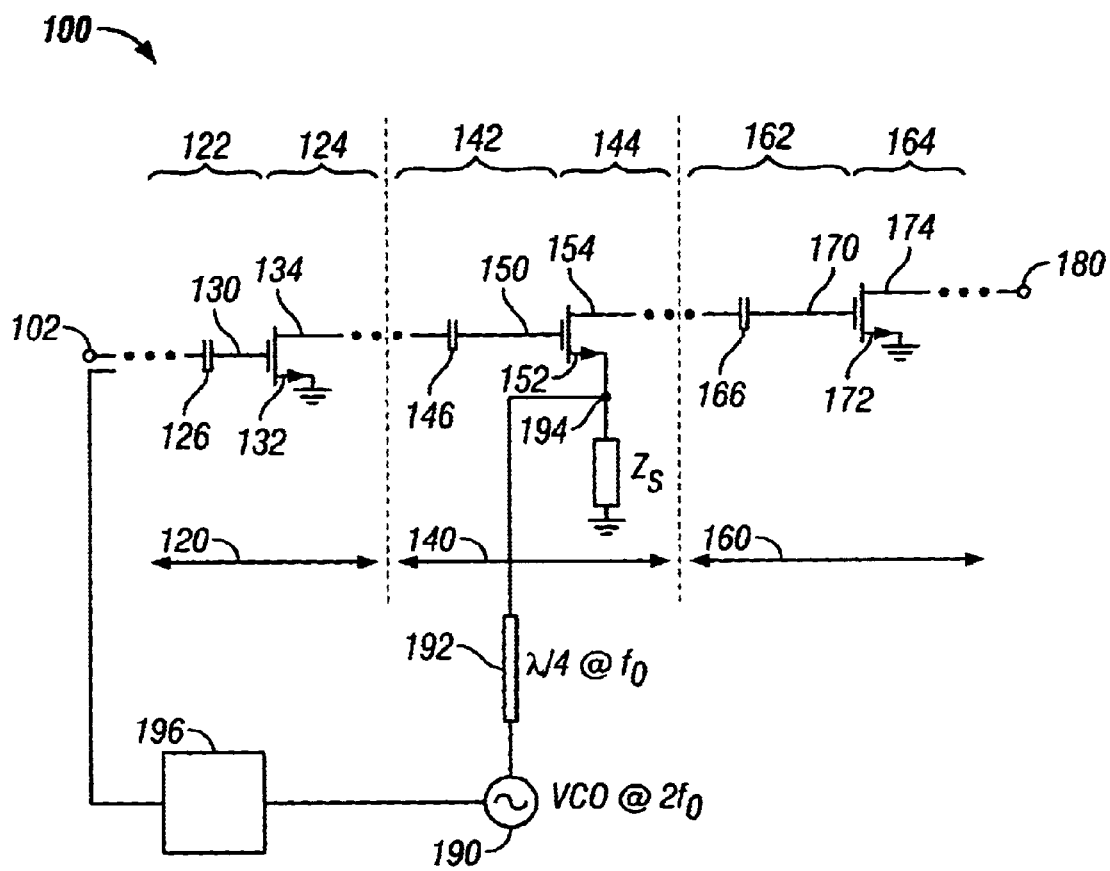

FIG. 1 illustrates a simplified circuit diagram of a first embodiment in accordance with the present invention. A power amplifier device 100 includes an amplification chain comprising a first amplification stage 120, a second amplification stage 140, and a third and final amplification stage 160. The number of amplification stages in the amplification chain may vary, depending on the requirements of the specific application. Also, the structure of each amplification stage can vary, even though amplification stages 120, 140, and 160 here are shown to have similar structures. An input signal of a fundamental frequency is provided at an input point 102 connected to the first amplification stage 120. The input signal is amplified by the amplification stages 120, 140, and 160 and eventually outputted as an output signal at an output point 180 connected to the final amplification stage 160.

In detail, the first amplification stage 120 includes a first bias network 122 and a first transistor 124. The first bias network 122 controls the bias voltage of the first transistor 124 and includes at least a coupling capacitor 126. The input point 102 is directly or indirectly connected to a first terminal of the coupling capacitor 126. A second terminal of the coupling capacitor 126 is connected to a gate terminal 130 of the first transistor 124. A source terminal 132 of the first transistor 124 is connected to ground. A drain terminal 134 of the first transistor 124 is connected to the second amplification stage 140. The first amplification stage 120 amplifies the input signal provided at the input point 102 and outputs the resulting signal as a first stage output signal at the drain terminal 134.

The second amplification stage 140 includes a second bias network 142 and a second transistor 144. The second bias network 142 controls the bias voltage of the second transistor 144 and includes at least a coupling capacitor 146. The drain terminal 134 of the first transistor 124 is directly or indirectly connected to a first terminal of the coupling capacitor 146. A second terminal of the coupling capacitor 146 is connected to a gate terminal 150 of the second transistor 144. A source terminal 152 of the second transistor 144 is connected to ground. A drain terminal 154 of the second transistor 144 is connected to the third amplification stage 160. The second amplification stage 140 amplifies the first stage output signal and outputs the resulting signal as a second stage output signal at the drain terminal 154.

The third and final amplification 160 stage includes a third bias network 162 and a third transistor 164. The third bias network 162 controls the bias voltage of the third transistor 164 and includes at least a coupling capacitor 166. The drain terminal 154 of the second transistor 144 is directly or indirectly connected to a first terminal of the coupling capacitor 166. A second terminal of the coupling capacitor 166 is connected to a gate terminal 170 of the third transistor 164. A source terminal 172 of the third transistor 164 is connected to ground. A drain terminal 174 of the third transistor 164 is directly or indirectly connected to an output point 180. The third amplification stage 160 amplifies the second stage output signal and outputs the resulting signal at the output point 180 as the final output signal of the power amplifier device 100.

In FIG. 1, transistors 124, 144, and 164 are shown in common source configurations. However, common drain or common gate configurations are also consistent with the present invention. Furthermore, the invention is not restricted to transistors and can be embodied in any active device of three or more terminals including a control terminal and a controlled terminal.

A second harmonic signal corresponding to the input signal provided at the input point 102 is inserted into the second amplification stage 140. The second harmonic signal has a second harmonic frequency that is substantially twice the fundamental frequency of the input signal. Alternatively or additionally, a third harmonic signal of a third harmonic frequency that is substantially three times the fundamental frequency of the input signal, can be inserted. Alternatively or additionally, a harmonic signal of a order higher than three can be inserted. Thus, more than one harmonic signal, corresponding to different harmonic frequencies, can be inserted. Also, the harmonic signal(s) may be inserted at an earlier or later amplification stage.

Here, the second harmonic signal is inserted into the second bias network 142 of the second amplification stage 140. A voltage controlled oscillator (VCO) 190 located outside the amplification chain, which comprises amplification stages 120, 140, and 160, generates the second harmonic signal corresponding to the input signal, at the second harmonic frequency. The VCO 190 is connected to one end of a quarter-wave transmission line 192 (relative to the fundamental frequency). The other end of the quarter-wave transmission line is connected to an insertion point 194 defined at the second terminal of the coupling capacitor 146 of the second bias network 142 of the second amplification stage 140. The second harmonic signal generated at the VCO 190 is transmitted through the quarter-wave transmission line 192 and inserted into the bias network 142 at the insertion point 194. To a signal at the insertion point 194 of a frequency at or near the fundamental frequency of the input signal, the path leading to the quarter-wave transmission line 192 is substantially an open circuit. However, to a signal at insertion point 194 of a frequency at or near the second harmonic frequency, the path appears to be a short circuit. Thus, the second harmonic signal transmitted through the quarter-wave transmission line 192 is inserted into the insertion point 194. It should be noted that other fractional-wave transmission lines may be suitable in other implementations. Alternatively, a resonant network may be used instead of a fractional-wave transmission line to insert the appropriate harmonic signal(s).

Thus, a drive signal is formed including a fundamental signal component corresponding to the input signal and a harmonic signal component correpsonding to the second harmonic signal. The drive signal is provided to the gate terminal 150 of the second transistor 144.

The presence of the harmonic signal component in the drive signal affects the drain efficiency of the second transistor 144 of the second amplification stage 140 and the third transistor 164 of the final amplification stage 160. Using a control block 196 coupled to the input point 102 and connected to the VCO 190 to control the relative amplitude and relative phase of the fundamental signal component and the harmonic signal component, such drain efficiencies can be optimized for the power amplifier device 100. Note that the desired values of such relative amplitude and relative phase can vary according to different conditions. Thus, the control block 196 is capable of dynamically controlling the relative amplitude and relative phase according to signal level, frequency, and/or other factors corresponding to the input signal, the fundamental signal component, and/or the harmonic signal component.

Use of the VCO 190 to generate the second harmonic signal allows operation of the power amplifier device 100 over a wide dynamic range of at least an order of magnitude of signal level of the input signal. As the signal level of the input signal decreases (or increases), this configuration allows the desired (and possibly dynamically varying) proportion of signal levels to be maintained between fundamental signal component and the harmonic signal component. Furthermore, inserting the second harmonic signal into a bias network such as the second bias network 142, at insertion point 194, allows flexibility in design and utilization of existing architecture.

Figure 2:
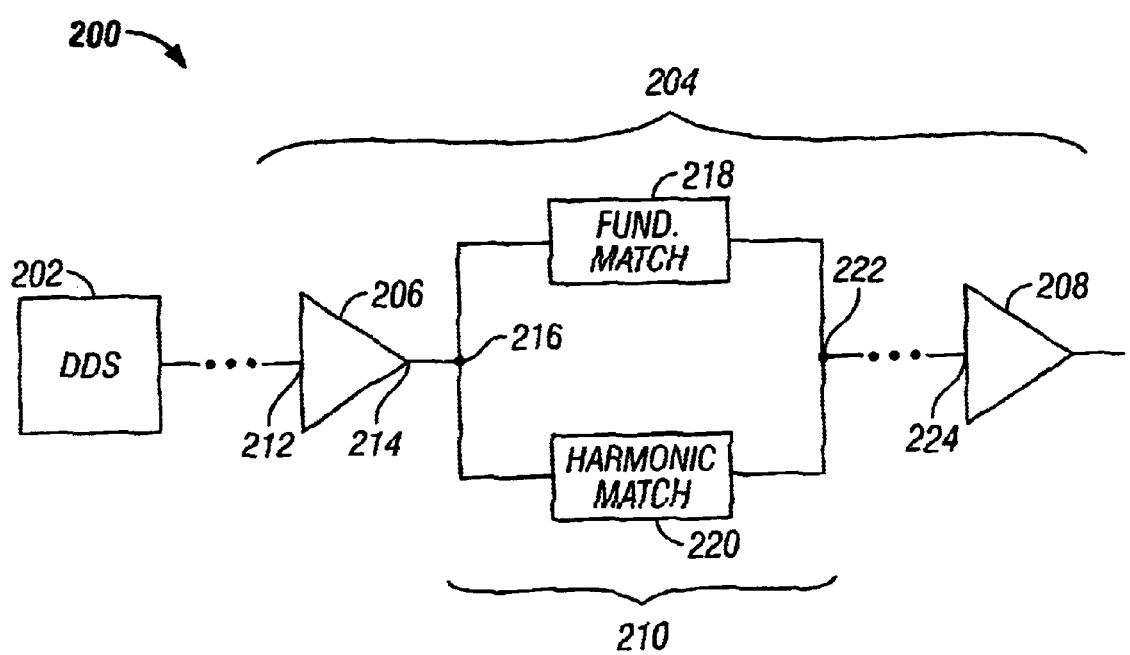
FIG. 2 is a block diagram of a second embodiment in accordance with the present invention.

FIG. 2 is a block diagram of a second embodiment in accordance with the present invention. A power amplifier device 200 includes a digital synthesizer, herein a direct digital synthesizer (DDS) 202, and an amplification chain 204. The amplification chain 204 includes at least a final amplification stage 208 and may include other amplification stages such as amplification stage 206. The amplification chain may include one or more interstage matching networks, such as the interstage matching network 210, connecting consecutive amplification stages.

The DDS 202 is connected directly or indirectly to an input port 212 of the amplification stage 206. The DDS 202 synthesizes a drive signal containing a fundamental signal component associated with an input signal provided to the amplifier device 200 and having a fundamental frequency. The drive signal also contains at least a harmonic signal component of a harmonic frequency that is substantially a multiple of the fundamental frequency.

Here, the DDS 202 is operative to control the relative amplitude and relative phase shift of the fundamental signal component and the harmonic signal component at desired values such that the efficiency of the amplification chain 204 and/or efficiency of a particular amplification stage is optimized. Note that the desired values of relative amplitude and relative phase of the fundamental signal component and the harmonic signal component can vary according to different conditions. Thus, the DDS 202 is capable of dynamically controlling the relative amplitude and relative phase according to signal level, frequency, and/or other factors corresponding to the input signal, the fundamental signal component, and/or the harmonic signal component.

The DDS 202 allows generation of the drive signal and operation of the amplifier device 200 over a wide dynamic range of at least an order of magnitude of signal level of the input signal. As the signal level of the input signal decreases (or increases), this configuration allows the desired proportion of signal levels to be maintained between the fundamental signal component and the harmonic signal component.

The harmonic signal component can correspond to a second harmonic frequency that is substantially twice the fundamental frequency. Alternatively or additionally, the harmonic signal component can correspond to a third harmonic frequency that is substantially three times the fundamental frequency. Alternatively or additionally, the harmonic signal component can correspond to a harmonic frequency of an order higher than three. Thus, the drive signal can contain more than one harmonic signal component, corresponding to different harmonic frequencies.

The drive signal may be processed before being transmitted to the input port 212 of the amplification stage 206. Such processing may include a digital-to-analog conversion (not shown), and/or others. The amplification stage 206 produces an amplified signal at an output port 214, which is connected to the interstage matching network 210 at a first node 216. The interstage matching network 210 includes a fundamental frequency matching block 218 and a harmonic frequency matching block 220. The first node 216 is connected to a first terminal of the fundamental frequency matching block 218 and to a first terminal of the harmonic frequency matching block 220. The other terminal of the fundamental frequency matching block 218 and the other terminal of the harmonic frequency matching block 220 are connected to a second node 222. The second node 222 is connected to the next amplification stage, here the final amplification stage 208.

The interstage matching network 210 performs impedance matching between consecutive amplification stages, here amplification stage 206 and the final amplification stage 208. As the amplified signal at the output port 214 is transmitted through the interstage matching network 210, the fundamental frequency component of the signal and the harmonic frequency component of the signal are separately transmitted through the fundamental frequency matching block 218 and the harmonic frequency matching block 220, respectively. The blocks 218 and 220 can also provide further adjustments to the attenuation and phase shift of the fundamental frequency component and the harmonic frequency component of the signal.

An input port 224 of the final amplification stage 208 is directly or indirectly connected to the second node 222 and receives the signal transmitted through the interstage matching network 210. Note that there may be additional amplifier stage(s) and interstage matching network(s) connected between the second node 222 and the input port 224 of the final amplification stage 208. The presence of the harmonic frequency component affects the drain efficiencies associated with one or more of the amplification stages. By controlling the relative amplitude and relative phase of the fundamental frequency component and the harmonic frequency component of the drive signal, as well as amplified signals along the amplification chain 204, such drain efficiencies can be optimized for the power amplifier device 200.

Figure 3:
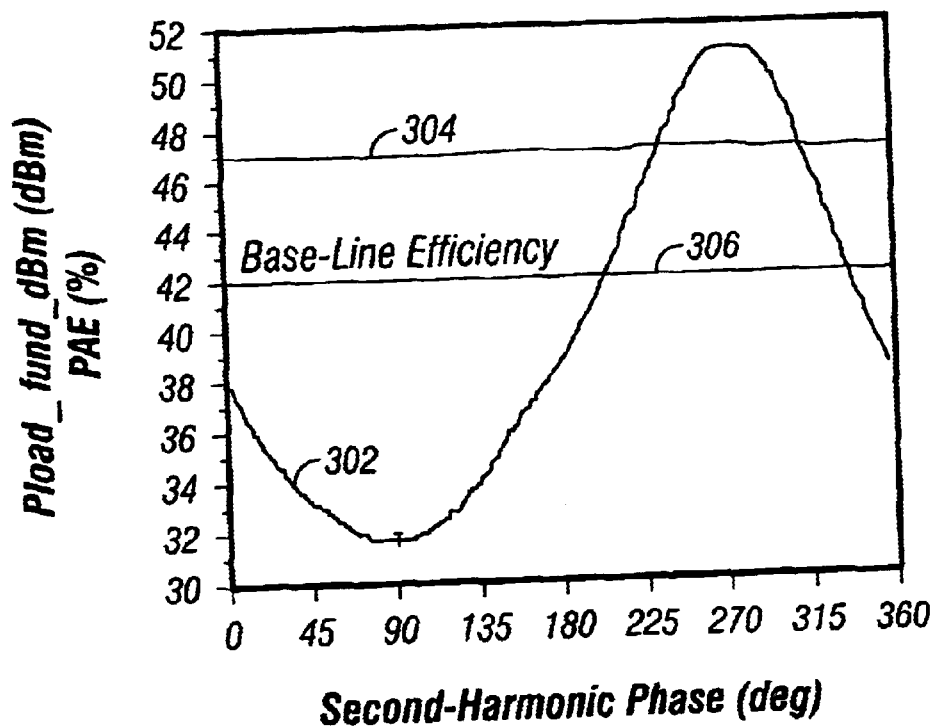
FIG. 3 illustrates simulated result showing the Power Added Efficiency and power delivered to the load, plotted against the phase of the second harmonic component relative to the phase of the fundamental component of the stimulus signal.
Figure 4:
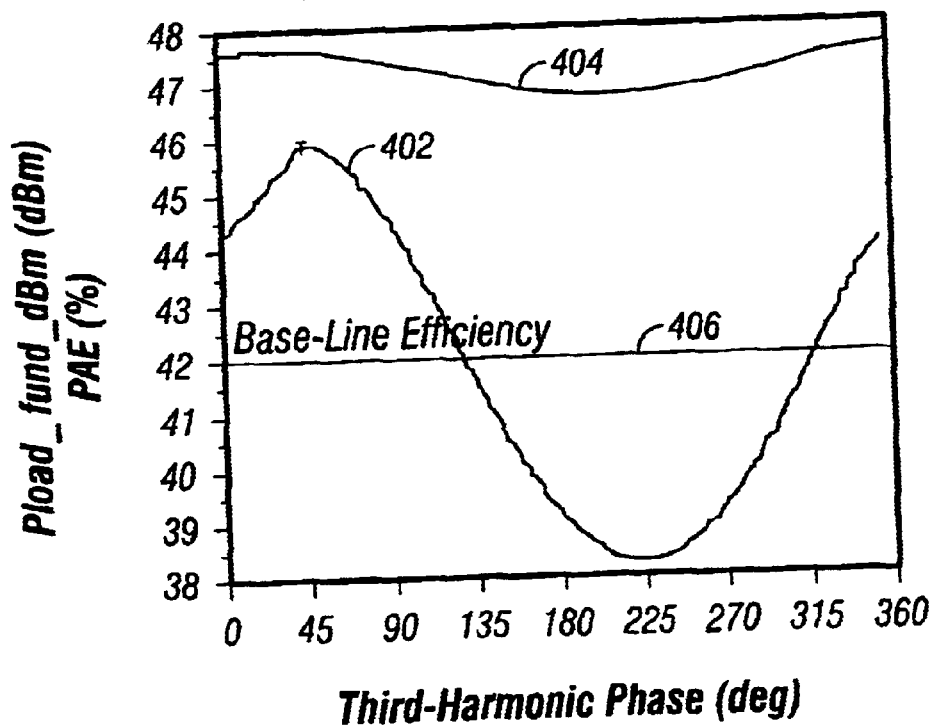
FIG. 4 illustrates simulated result showing the Power Added Efficiency and Power Delivered to the Load, plotted against the phase of the third harmonic component relative to the phase of the fundamental component of the stimulus signal.

FIGS. 3–5 show results of simulation verifying the efficiency improvements predicted for a system in accordance with the present invention. For these results, non-linear simulations using Advanced Design System (ADS) simulation software manufactured by Agilent Technologies, Inc. of Palo Alto, Calif. were performed on a single-stage amplifier using a non-linear MESFET model. The model parameters were extracted to represent a device with approximately 100 Watts power capability and 15 dB of power gain at 1 GHz. All standard parasitics were included. The source was generated as a single-tone unmodulated stimulus with fundamental, second, and third harmonic components whose magnitude and phase were controlled arbitrarily.

FIG. 3 is a plot of both the Power Added Efficiency (PAE) 302 of the amplifier and the power delivered to the load (Pload_fund_dBm) 304, plotted against the phase of the second harmonic component relative to the phase of the fundamental component of the stimulus signal. Also plotted is the baseline PAE value 306 corresponding to no harmonic input. As can be seen, the PAE associated with the stimulus containing a second harmonic approximately shows a 9% improvement over the baseline PAE at a relative phase of 270 degrees.

FIG. 4 is a plot of both the Power Added Efficiency (PAE) 402 of the amplifier and the Power Delivered to the Load (Pload_fund_dBm) 404, plotted against the phase of the third harmonic component relative to the phase of the fundamental component of the stimulus signal. Also plotted is the baseline PAE value 406 corresponding to no harmonic input. As can be seen, the PAE associated with the stimulus containing a third harmonic approximately shows a 4% improvement over the baseline PAE at a relative phase of 45 degrees.

Figure 5A:
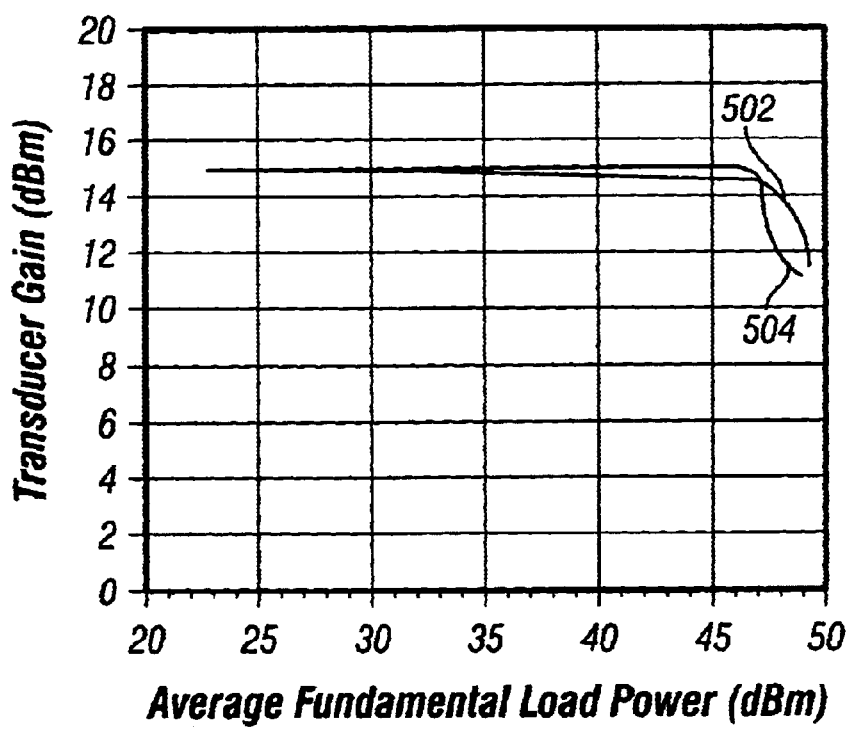
FIGS. 5A–5D show, in various performance measures, the comparison between a standard power amplifier and a power amplifier receiving a input signal containing a second harmonic component in accordance with the best Power Added Efficiency value shown in FIG. 3.
Figure 5B:
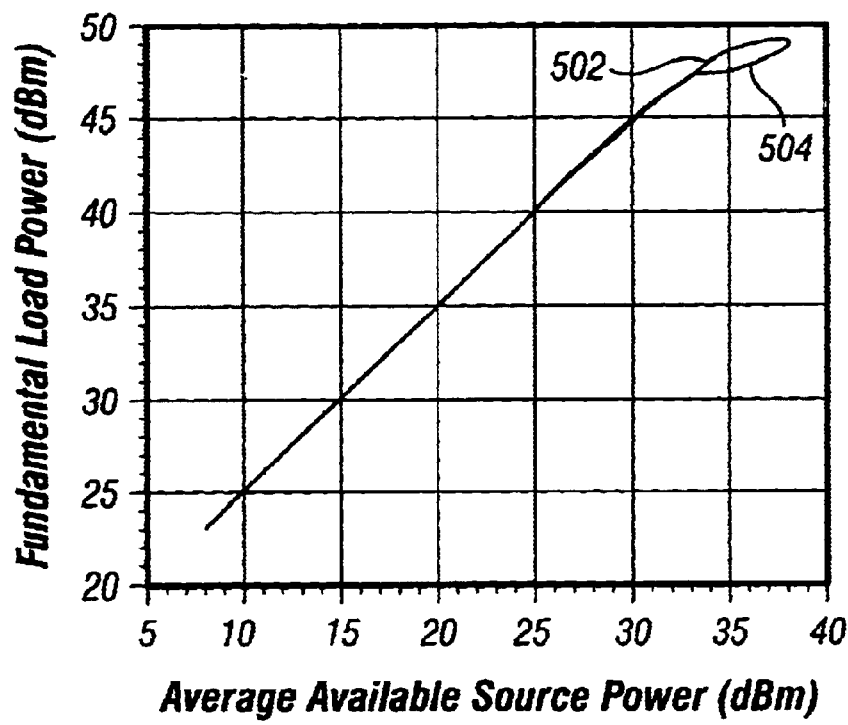
Figure 5C:
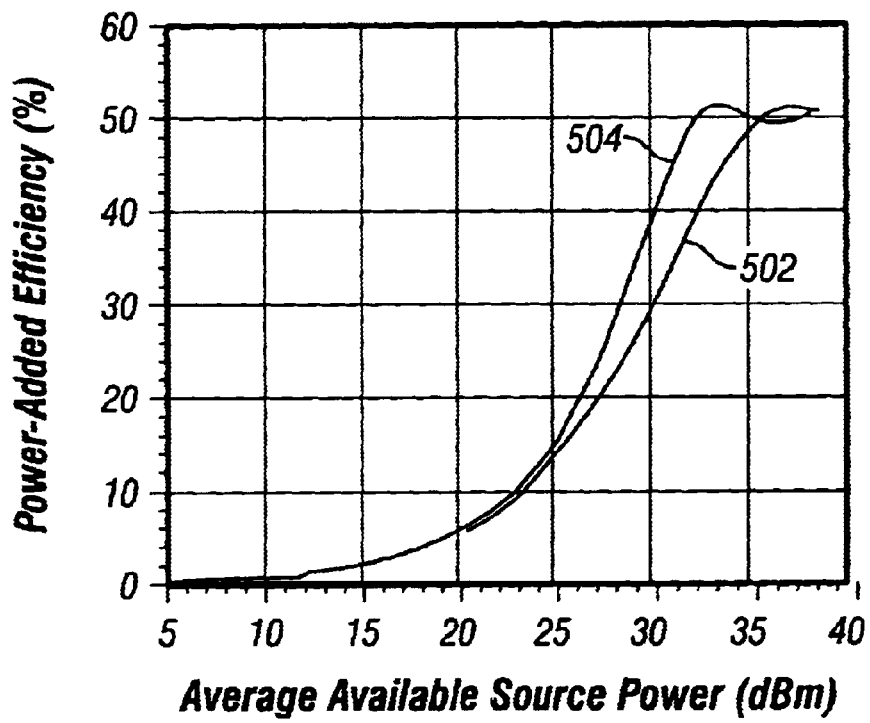
Figure 5D:
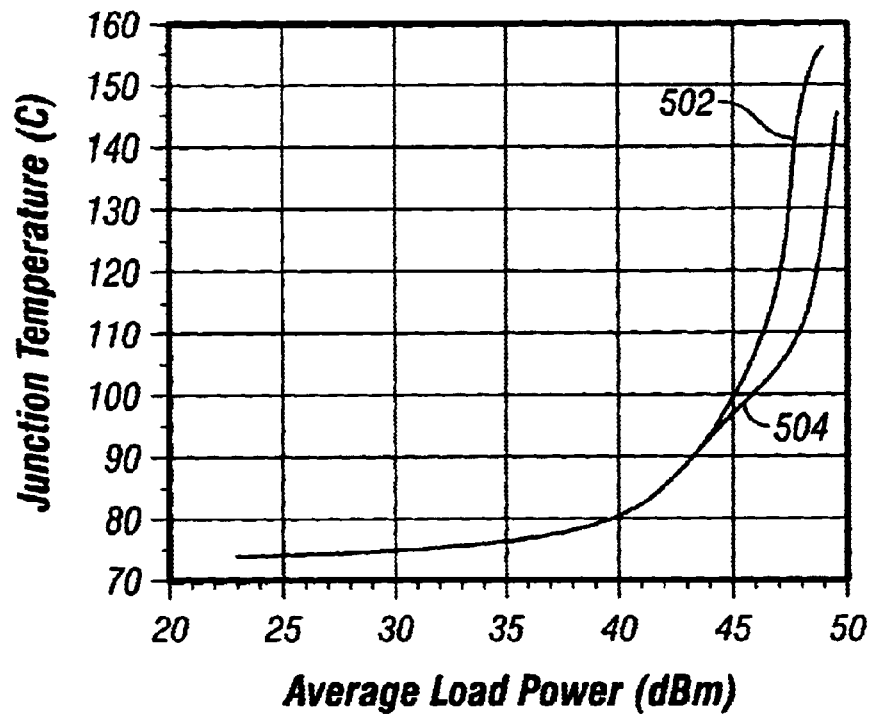

FIGS. 5A–5D show, in various performance measures, the comparison between performance 502 of a standard power amplifier (standard PA) and performance 504 of a power amplifier receiving a input signal containing a second harmonic component in accordance with the best PAE value shown in FIG. 3 (second-harmonic optimized PA) 504. FIG. 5A plots the Transducer gain versus the Average Fundamental Load Power; FIG. 5B plots the Average Load Power versus the Average Available Source Power; FIG. 5C plots the Power-Added Efficiency Under Efficient Loading versus the Average Available Source Power; and FIG. 5D plots the Junction Temperature Under Efficiency Loading versus the Average Load Power. As can be seen, the second-harmonic optimized PA, when compared to the standard PA, provides nearly identical power and gain while exhibiting a significant improvement in efficiency and reduction in junction temperature.

Although the present invention has been described in terms of specific embodiments, it should be apparent to those skilled in the art that the scope of the present invention is not limited to the described specific embodiments.

The specification and drawings are, accordingly, to be regarded in an illustrative rather than a restrictive sense. It will, however, be evident that additions, subtractions, substitutions, and other modifications may be made without departing from the broader spirit and scope of the invention as set forth in the claims.

What is claimed is:

1. A method for high efficiency operation of a power amplifier device including at least a final amplification stage, the method comprising:

generating a first signal having a harmonic component with a harmonic frequency that is an integer multiple of a fundamental frequency of a fundamental frequency signal;

conditioning said first signal such that any fundamental frequency components in said first signal are made to have substantially zero amplitude at a combining node of said power amplifier device;

combining, at said combining node, said conditioned first signal with a second signal having a fundamental frequency component, to form a drive signal;

providing said drive signal to said power amplifier device; and in response to said drive signal, producing an amplified output signal at said final amplification stage.

2. The method of claim 1, wherein said relative phase shift and relative amplitude are dynamically controlled according to different values of frequency and/or signal level of said fundamental frequency signal and/or said harmonic component.

3. The method of claim 1 wherein said harmonic component is a second harmonic of said fundamental frequency signal.

4. The method of claim 1 wherein said harmonic component is a third harmonic of said fundamental frequency signal.

5. The method of claim 1 wherein said harmonic component is a harmonic of an order higher than three.

6. The method of claim 1, wherein said drive signal contains, in addition to said fundamental component, a plurality of additional harmonic components, each harmonic component having an associated harmonic frequency that is substantially an integer multiple of said fundamental frequency, wherein relative phase shifts and relative amplitudes of said fundamental frequency component and each of said harmonic components is controllable over at least an order of magnitude of dynamic range of said input signal.

7. The method of claim 1 wherein said step of generating a first signal further comprises operating a voltage controlled oscillator (VCO) at substantially said harmonic frequency to produce said harmonic component.

8. The method of claim 1 wherein said step of conditioning said first signal further comprises transmitting said harmonic signal component through a fractional wave transmission line to said combining node.

9. The method of claim 8 wherein said fractional wave transmission line comprises a quarter wave transmission line.

10. The method of claim 1 wherein said step of conditioning said first signal further comprises transmitting said harmonic signal component through a resonant network to said combining node.

11. The method of claim 1 wherein said drive signal is provided to said power amplifier device at a gate terminal of a power transistor associated with said power amplifier device.

12. The method of claim 1 wherein said drive signal is provided to said power amplifier device at a drain terminal of a power transistor associated with said power amplifier device.

13. The method of claim 1 wherein said drive signal is provided to said power amplifier device at a source terminal of a power transistor associated with said power amplifier device.

14. The method of claim 1 wherein said drive signal is provided to said power amplifier device at a control terminal of an active device of three or more terminals associated with said power amplifier device.

15. The method of claim 1 wherein said drive signal is provided to said power amplifier device at a controlled terminal of an active device of three or more terminals associated with said power amplifier device.

16. A method for high efficiency operation of a power amplifier device including at least one amplification stage, said power amplifier device receiving an input signal of a fundamental frequency at an input amplification stage, the method comprising:

provided at a terminal of a first active device of three or more terminals of a first amplification stage a representation of said input signal;

providing at a terminal of a second active device of three or more terminals of a second amplification stage at least one harmonic signal of a harmonic frequency that is substantially an integer multiple of said fundamental frequency; and in response to said representation of said input signal and said harmonic signal, producing an amplified output signal at an output of said power amplifier device.

17. An apparatus for amplifying an RF input signal comprising:

an amplification chain to which said RF input signal is applied, the amplification chain having at least one amplification stage, one amplification stage of the at least one amplification stage including an active device having three or more terminal, one of said terminals embodying an injection point for injecting a harmonic signal; and means for generating a harmonic signal, the harmonic signal being coupled to the injection point without any associated fundamental frequency component, wherein properties of the harmonic signal are controllable so as to improve the drain efficiency of apparatus.

18. The apparatus of claim 17 wherein said means for generating said harmonic signal comprises a voltage controlled oscillator (VCO).

19. The apparatus of claim 17 wherein said means for generating said harmonic signal comprises a digital synthesizer.

20. A system for high efficiency operation of a power amplifier device including at least a final amplification stage, the system comprising:

means for generating a first signal having a harmonic component with a harmonic frequency that is an integer multiple of a fundamental frequency of a fundamental frequency signal;

means for conditioning said first signal such that any fundamental frequency components in said first signal are made to have substantially zero amplitude at a combining node of said power amplifier device;

means for combining, at said combining node, said conditioned first signal with a second signal having a fundamental frequency component, to form a drive signal;

means for providing said drive signal to said power amplifier device; and means for producing an amplified output signal at said final amplification stage in response to said drive signal.

21. The method of claim 1 wherein relative phase shift and relative amplitude of said fundamental frequency component and said at least one harmonic component are controllable over at least an order of magnitude of dynamic range of said input signal.

22. The method of claim 16, wherein relative phase shift and relative amplitude of said representation of said input signal and said harmonic signal are controllable over at least an order of magnitude of dynamic range of said input signal.

23. An amplifier apparatus, comprising:

an amplification chain having a plurality of amplifier stages;

means for producing a drive signal and coupling said drive signal to an input of a first of said amplifier stages of said plurality of amplifier stages; and a matching network coupled between two amplifier stages of said plurality of amplifier stages configured to receive a derivative of said drive signal, said matching network including a fundamental frequency conditioning branch and a harmonic frequency conditioning branch, wherein said matching network is operable to adjust the relative phase and/or amplitudes of a fundamental frequency component and one or more harmonics component of said derivative of said drive signal.

24. The amplifier apparatus of claim 23 wherein said means for producing a drive signal comprises a digital synthesizer.

25. A system for high efficiency operation of a power amplifier device having at least one amplification stage, said power amplifier device receiving an input signal of a fundamental frequency at in input amplification stage, the system comprising:

means for providing at a terminal of a first active device of a first amplification stage said input signal or a derivative of said input signal;

means for providing at a terminal of a second active device of a second amplification stage at least one harmonic signal of a harmonic frequency that is substantially an integer multiple of said fundamental frequency; and means for producing an amplified output signal at an output of said system, in response to said input signal or derivative of said input signal and said harmonic signal.

* * * * *

UNITED STATES PATENT AND TRADEMARK OFFICE
CERTIFICATE OF CORRECTION

PATENT NO. : 6,624,695 B2 Page 1 of 1
DATED : September 23, 2003
INVENTOR(S) : John Sevic and Khan M. Salam It is certified that error appears in the above-identified patent and that said Letters Patent is hereby corrected as shown below:

<u>Title page, Item [54] and Column 1, line 1,</u>
Title, replace "PERSHAPING" with -- PRESHAPING --.

<u>Column 8,</u>
Line 12, replace "1" with -- 21 --.

<u>Column 9,</u>
Line 25, replace "terminal" with -- terminals --.

Signed and Sealed this

Second Day of March, 2004

JON W. DUDAS
*Acting Director of the United States Patent and Trademark Office*